(12) United States Patent
Song et al.

(10) Patent No.: US 8,044,392 B2
(45) Date of Patent: Oct. 25, 2011

(54) DISPLAY DEVICE AND METHOD FOR MANUFACTURING THE SAME

(75) Inventors: Keun-kyu Song, Yongin-si (KR); Bo-sung Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/835,655

(22) Filed: Jul. 13, 2010

(65) Prior Publication Data

US 2010/0276681 A1   Nov. 4, 2010

Related U.S. Application Data

(62) Division of application No. 11/595,028, filed on Nov. 8, 2006, now Pat. No. 7,781,759.

(30) Foreign Application Priority Data

Nov. 17, 2005   (KR) .................. 10-2005-0110230

(51) Int. Cl.
*H01L 33/00* (2010.01)

(52) U.S. Cl. ............................ 257/40; 349/43

(58) Field of Classification Search ............ 257/40, 257/72, 313, 642, 428, 82–84; 345/173; 349/43, 192
See application file for complete search history.

(56) References Cited

U.S. PATENT DOCUMENTS

| | | | |
|---|---|---|---|
| 6,624,871 B1 | 9/2003 | Kim | |
| 6,905,903 B2 | 6/2005 | Hasegawa et al. | |
| 6,954,249 B2 | 10/2005 | Muramatsu et al. | |
| 7,388,227 B2 * | 6/2008 | Oh | 257/72 |
| 2002/0180901 A1 | 12/2002 | Kim | |
| 2003/0047729 A1 | 3/2003 | Hirai et al. | |
| 2004/0222421 A1 | 11/2004 | Lee et al. | |
| 2004/0238816 A1 * | 12/2004 | Tano et al. | 257/40 |
| 2004/0238886 A1 | 12/2004 | Lee et al. | |
| 2004/0259283 A1 | 12/2004 | Koo et al. | |
| 2006/0023138 A1 | 2/2006 | Choi et al. | |
| 2006/0060858 A1 | 3/2006 | Park et al. | |
| 2006/0061702 A1 * | 3/2006 | Seo et al. | 349/43 |
| 2006/0063351 A1 * | 3/2006 | Jain | 438/455 |
| 2006/0132461 A1 | 6/2006 | Furukawa et al. | |
| 2007/0194312 A1 | 8/2007 | Chuman et al. | |

FOREIGN PATENT DOCUMENTS

| | | |
|---|---|---|
| CN | 1361510 | 7/2002 |
| CN | 1385743 | 12/2002 |
| CN | 1512222 | 7/2004 |
| CN | 1673814 | 9/2005 |

(Continued)

*Primary Examiner* — Marcos D Pizarro Crespo
*Assistant Examiner* — Sue Tang
(74) *Attorney, Agent, or Firm* — Innovation Counsel LLP

(57) ABSTRACT

A display device includes an insulating substrate; a plurality of gate wires formed on the insulating substrate, the plurality of gate wires including a gate electrode; a gate insulating layer covering the plurality of gate wires; a transparent electrode layer formed on the gate insulating layer, the transparent electrode layer including a source electrode and a drain electrode disposed about the gate electrode and spaced apart from each other to define a channel region disposed therebetween; a plurality of data wires covering a predetermined portion of the transparent electrode layer and being crossed insulatedly with the plurality of gate wires to define pixels; and an organic semiconductor layer formed on the channel region for each pixel, a predetermined portion of the organic semiconductor layer being operatively connected with the source electrode, the drain electrode, and the gate electrode to form a transistor having an improved characteristic and a novel structure.

12 Claims, 14 Drawing Sheets

FOREIGN PATENT DOCUMENTS

| | | |
|---|---|---|
| JP | 2004-146430 | 5/2004 |
| JP | 2004-266197 | 9/2004 |
| JP | 2005-064496 | 10/2005 |
| KR | 10-0171980 B1 | 10/1998 |
| KR | 2000-0045396 | 7/2000 |
| TW | 573167 | 1/2004 |
| TW | 588185 | 5/2004 |
| TW | 1222048 | 10/2004 |
| TW | 1234033 | 6/2005 |
| WO | 2005-020343 A1 | 3/2005 |

\* cited by examiner

DISPLAY DEVICE AND METHOD FOR MANUFACTURING THE SAME

CROSS-REFERENCE TO RELATED APPLICATION

This application is a divisional of U.S. patent application Ser. No. 11/595,028, filed on Nov. 8, 2006, which claims priority to Patent Application No. 2005-0110230, filed on Nov. 17, 2005, in the Korean Intellectual Property Office, Republic of Korea, the entire contents of which are hereby incorporated by reference.

BACKGROUND (a) Field of the Invention

The present invention relates to a display device and a method for manufacturing the same, and more particularly, to a display device comprising an organic thin film transistor and a method for manufacturing the same.

(b) Description of the Related Art

Recently, flat panel display devices having the dual advantages of smaller size and lighter weight have received increasing attention in the marketplace. Such a flat display device typically comprises a liquid crystal display (LCD) and an organic light emitting diode (OLED). In general, the liquid crystal display device comprises a thin film transistor substrate on which a thin film transistor is provided, a color filter substrate on which a color filter is provided and a liquid crystal layer interposed between both substrates.

In this case, the thin film transistor substrate is the switching and driving element for controlling the operation of each pixel where each thin film transistor comprises a gate electrode, a source electrode and a drain electrode spaced from each other with the gate electrode as a center to define a channel region and a semiconductor layer. Amorphous silicon or poly silicon typically forms the semiconductor layer. According to a recent study related to applying an organic semiconductor to the semiconductor layer, the organic semiconductor can be formed at a normal temperature and pressure, and so that the manufacturing costs may be reduced and the organic semiconductor layer can be formed on a plastic substrate which is vulnerable to heat.

However, a work function of organic semiconductor is larger than that of aluminum, chrome, molybdenum or the like used as the source and drain electrodes, and so a characteristic of the organic thin film transistor is undesirable. Accordingly, instead of the above metals, transparent electrode material such as indium tin oxide (ITO) or indium zinc oxide (IZO) having a work function which is similar to or larger than that of organic semiconductor is used for forming the source electrode and the drain electrode. However, ITO or IZO is disadvantageous in that a resistance of ITO or IZO is large so that the electrode made of ITO or IZO is not suited to the data wires. In order to solve the above problem, an organic thin film transistor having a buried data wire structure in which data wires made of metal with a low resistance are provided at a lower side, a source electrode and a drain electrode is made of indium tin oxide or indium zinc oxide and data wires are connected to the source and drain electrodes has been developed and manufactured.

However, the above mentioned buried data wire structure is not effective in that a manufacturing process is complicated, and a great number of masks are required for carrying out the manufacturing process so that manufacturing cost is increased.

SUMMARY OF THE INVENTION

Accordingly, it is an aspect one or more embodiments of the present invention to provide a display device comprising an organic thin film transistor having improved characteristics and a novel structure. Another object of one or more embodiments of the present invention is to provide the method for manufacturing the display device comprising the organic thin film transistor that has the new structure and can be manufactured by the manufacturing process is provided.

The foregoing and/or other aspects of embodiments of the present invention can be achieved by providing a display device comprising an insulating substrate; a plurality of gate wires formed on the insulating substrate, the plurality of gate wires including a gate electrode; a gate insulating layer covering the plurality of gate wires; a transparent electrode layer formed on the gate insulating layer, the transparent electrode layer including a source electrode and a drain electrode disposed about the gate electrode, the source electrode and the drain electrode being spaced apart from each other to define a channel region disposed therebetween; a plurality of data wires covering a predetermined portion of the transparent electrode layer and being crossed insulatedly with the plurality of gate wires to define a plurality of pixels; and an organic semiconductor layer formed on the channel region for each pixel, a predetermined portion of the organic semiconductor layer being operatively connected with the source electrode, the drain electrode, and the gate electrode to form a transistor.

According to an aspect of the present invention, the transparent electrode layer and the plurality of data wires are electrically connected to each other. According to an aspect of the present invention, the gate wires further comprise a gate line formed on the insulating substrate in a first direction having a gate pad formed at an end portion of the gate line, and the plurality of data wires comprising a data line being crossed insulatedly with the gate line and a data pad provided at an end portion of the data line.

According to an aspect of the present invention, the data wires further comprise a metal layer formed on the gate pad contacting layer. According to an aspect of the present invention, the data line formed on the source electrode is spaced apart from the organic semiconductor layer.

According to an aspect of the present invention, the transparent electrode layer further comprise a pixel electrode contacted with the drain electrode and formed on at least a portion of the pixel; a data wire layer in contact with the source electrode through at least a portion thereof and formed along the plurality of data wires; and a gate pad contacting layer covering the gate pad. According to an aspect of the present invention, the transparent electrode layer comprises at least one of indium tin oxide (ITO) and indium zinc oxide (IZO).

According to an aspect of the present invention, the display device further comprises a first passivation layer formed on the channel region on the organic semiconductor layer. According to an aspect of the present invention, the display device further comprises a second passivation layer formed on the first passivation layer. According to an aspect of the present invention, the first passivation layer comprises a fluorine-based high molecular material and the second passivation layer comprising at least one of indium tin oxide and indium zinc oxide. According to an aspect of the present invention, the first passivation layer comprises any one of the group consisting of a cyclized transparent high molecular material obtained from copolymer of poly tetra fluoro ethylene (PTET), fluorinated ethylene propylene (FEP), poly fluoro alkoxy (PFA), ethylene tetra fluoro ethylene (ETFE), polyvinylidene fluoride (PVDF), and perfluoro (alkenylvinyl ethers).

According to an aspect of the present invention, the gate insulating layer comprises a first gate insulating layer and a second gate insulating layer, the first gate insulating layer comprising at least one of silicon nitride ($SiN_x$) and silicon oxide ($SiO_x$), and the second gate insulating layer comprises at least one of a silicon based polymer, azobis isobutiro nitrile (AIBN), tetra butyl ortho titanate ($Ti(Obu)_4$) and butanol.

According to an aspect of the present invention, the display device further comprises a wall where the channel region is surrounded by the wall and at least a predetermined portion of each of the drain electrode and the source electrode is exposed by the wall, the organic semiconductor layer being formed inside of the wall.

According to an aspect of the present invention, the organic semiconductor layer comprises a material selected from the group consisting of a derivative including tetracene or pentacene substituent; 4 to 8 oligothiophene coupling to one another through 2- and 5-positions of the tiophene rings; perylenetetracarboxylic dianhydride or an imide derivate thereof; naphtalenetetracarboxylic dianhydride or an imide derivate thereof; metalized phthalocyanine or an halogen derivate thereof, perylene or coronene and a derivate including subsitutents thereof; co-oligomer or copolymer of thienylene and vinylene; tiophene; thienylene or coronene and a derivate including substitutents thereof; and a derivate including one or more hydro carbon chains having 1 to 30 carbons in an aromatic or heteroaromatic ring of said materials.

The foregoing and/or other aspects of the present invention can be achieved by providing a method for manufacturing a display device, comprising: providing an insulating substrate; forming a plurality of gate wires on the insulating substrate the plurality of gate wires including a gate electrode; forming a gate insulating layer on the insulating substrate, the gate insulating layer covering the plurality of gate wires; forming sequentially a transparent electrode material layer and a data wire material layer on the gate insulating layer by applying transparent electrode material and data wire material; patterning the data wire material layer to form a plurality of data wires being crossed insulatedly with the plurality of gate wires to define a plurality of pixels, the patterning of the transparent electrode material layer forming a transparent electrode layer including a source electrode and a drain electrode disposed and spaced from each other on the gate electrode to define a channel region and a data wire layer, a predetermined portion of the data wire layer being in contacted with the source electrode that is formed along the plurality of data wires; and forming organic semiconductor layers on the channel regions for each pixel, a predetermined portion of the organic semiconductor layers being operatively connected with the corresponding source electrode, drain electrode, and gate electrode to form a transistor.

According to an aspect of the present invention, the organic semiconductor layer is formed by any one of an evaporation method and a coating method. According to an aspect of the present invention, the plurality of data wires further comprise a data line extended on the insulating substrate in a first direction and having a data pad formed at an end portion of the data line, the data wires and the data wire layer being electrically connected to each other. According to an aspect of the present invention, the gate wires comprise a gate line being crossed insulatedly with the data line and a gate pad formed at an end portion of the gate line, and a pixel electrode in contact with the drain electrode and formed on at least a predetermined portion of the pixel and a gate pad contact layer provided on the gate pad that are further formed in the patterning of the transparent electrode material layer.

According to an aspect of the present invention, a metal layer provided on the gate pad contact layer is formed in the patterning of the data wire material layer. According to an aspect of the present invention, the transparent electrode layer is made of one of indium tin oxide (ITO) and indium zinc oxide (IZO). According to an aspect of the present invention, the method for manufacturing the display device further comprises forming a gate pad contact hole through which the gate pad is exposed on the gate insulating layer before the forming of the data wire material layer and the transparent electrode material layer.

According to an aspect of the present invention, the method for manufacturing the display device further comprises forming a photosensitive layer, which has a pattern corresponding to a region on which the transparent electrode layer is formed, on the data wire material layer after the forming of the data wire material layer and the transparent electrode material layer. According to an aspect of the present invention, the method for manufacturing the display device further comprises removing the data wire material layer and the transparent electrode material layer exposed by the photosensitive layer to form the transparent electrode layer after the forming of the photosensitive layer. According to an aspect of the present invention, the method for manufacturing the display device further comprises reducing a height of the photosensitive layer corresponding to a region on which the data wires are not to be formed, after the removing of the data wire material layer and the transparent electrode material layer.

According to an aspect of the present invention, the method for manufacturing the display device further comprises providing only the photosensitive layer corresponding to a region on which the data wires are to be formed after the reducing of the height of the photosensitive layer. According to an aspect of the present invention, the method for manufacturing the display device further comprises patterning the data wire material layer using the provided photosensitive layer to form the data wires.

According to an aspect of the present invention, the method for manufacturing the display device further comprises forming a wall before the forming of the organic semiconductor layer such that the channel region is surrounded with the wall and at least a portion of each of the drain electrode and the source electrode is exposed by the wall, the organic semiconductor layer being formed inside of the wall. According to an aspect of the present invention, the organic semiconductor layer is formed by an ink jet deposition method.

According to an aspect of the present invention, the method for manufacturing the display device further comprises forming a first passivation layer on the channel region of the organic semiconductor layer, the first passivation layer comprising a fluorine-based high molecular material. According to an aspect of the present invention, the method for manufacturing the display device further comprises forming a second passivation layer on the first passivation layer, and the second passivation layer comprises at least one of indium tin oxide and indium zinc oxide.

BRIEF DESCRIPTION OF THE DRAWINGS

The above and/or other aspects and advantages of the prevent invention will become apparent and more readily appreciated from the following description of the exemplary embodiments, taken in conjunction with the accompany drawings, in which:

FIG. 3A to FIG. 3I are sectional views showing sequentially a method for manufacturing the display device according to one embodiment of the present invention.

Figure 1:
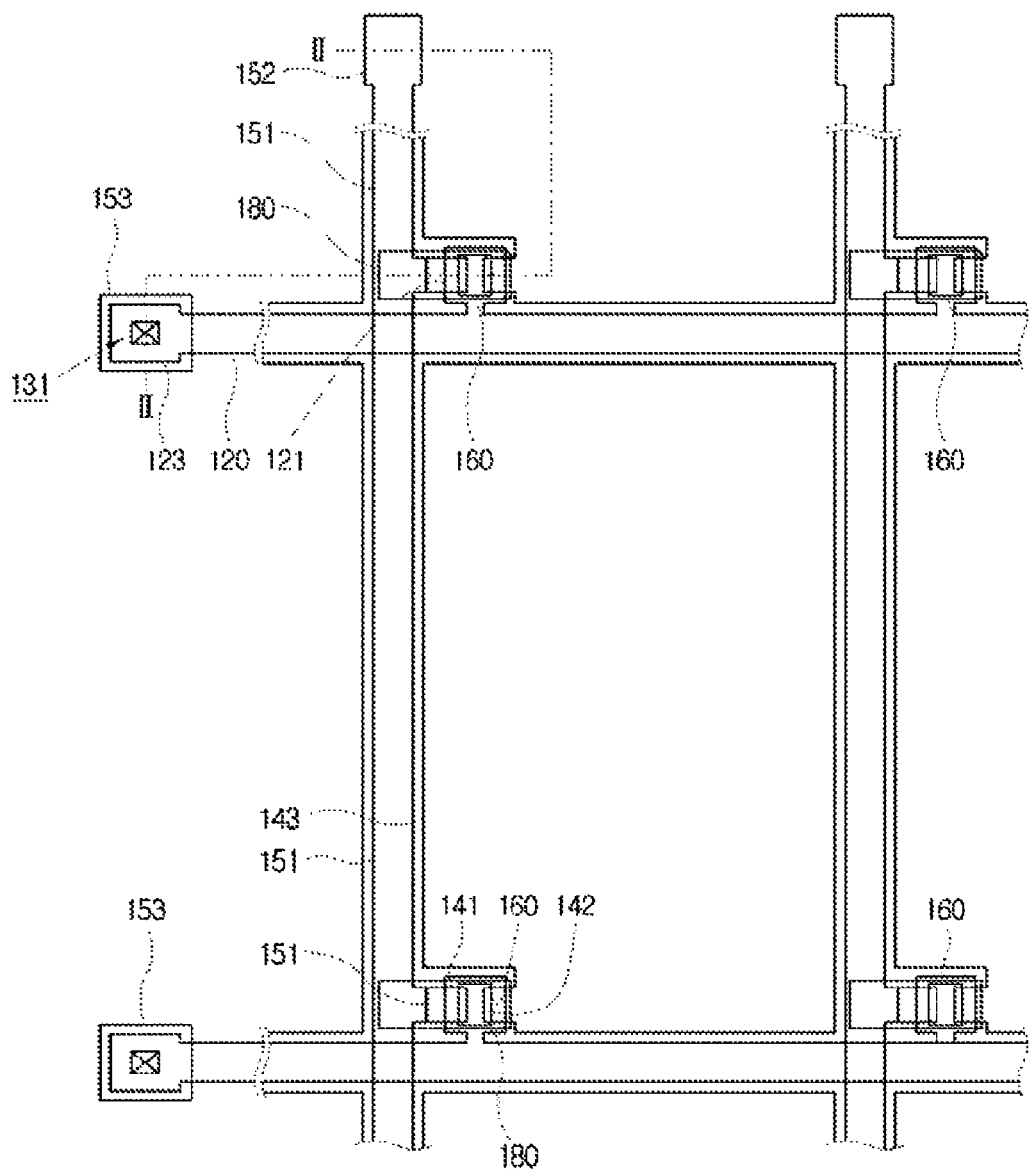
FIG. 1 is a view showing an arrangement state of the elements constituting the thin film transistor substrate according to one embodiment of the present invention.

DETAILED DESCRIPTION OF THE ILLUSTRATIVE, NON-LIMITING EMBODIMENTS OF THE INVENTION

Reference will now be made in detail to the embodiments of the present invention, examples of which are illustrated in the accompanying drawings, wherein like reference numerals refer to like elements throughout. The embodiments are described below so as to explain the present invention by referring to the figures. In the below description, a phrase of "a layer (film) is formed (provided) on another layer (film)" may include the situation where two layers (films) are adjacent to each other as well as the situation where a third layer (film) exists between two layers (films).

Figure 2:
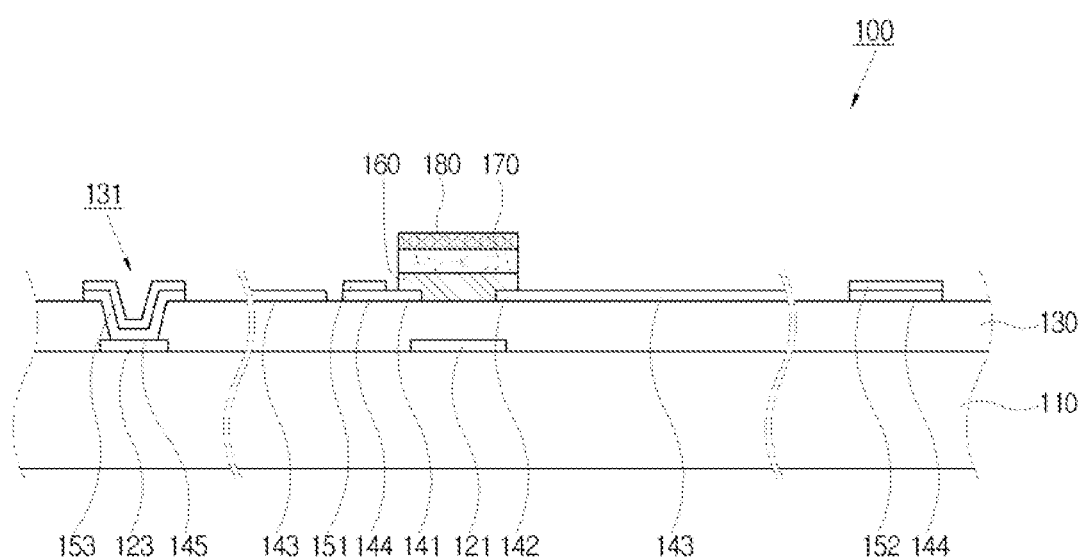
FIG. 2 is a sectional view taken along the line II-II in FIG. 1.

FIG. 1 is a view schematically showing an arrangement of elements constituting a thin film transistor substrate 100 according to one embodiment of the present invention, while FIG. 2 is a sectional view taken along the line II-II shown in FIG. 1. A thin film transistor substrate 100 according to an embodiment of the present invention comprises an insulating substrate 110; a plurality of gate wires 120, 121 and 123 formed on the insulating substrate 110 where the plurality of gate wires comprise a gate electrode 121; a gate insulating layer 130 covering the gate wires 120, 121 and 123 and formed on the insulating substrate 110; transparent electrode layers 141, 142, 143, 144 and 145 comprising the source electrode 141 and the drain electrode 142 formed on the gate insulating layer 130 and disposed such that two electrodes are spaced from each other with the gate electrode 121 as a center to define a channel region; data wires 151, 152 and 153 covering a portion of the transparent electrode layers 141, 142, 143, 144 and 145 and being crossed insulatedly, that is in an insulated manner, with the gate wires 120, 121 and 123 to define pixels; and organic semiconductor layers 160 formed on the channel regions, respectively.

The insulating substrate 110 can be made of glass or plastic. If the insulating substrate 110 is made of plastic, the insulating substrate is advantageous in that it is possible to give the flexibility to the thin film transistor substrate 100. However, there is also a drawback that the insulating substrate 110 is vulnerable to heat. As mentioned above, if the organic semiconductor layer 160 is used, since the semiconductor layer can be formed at a normal temperature and pressure, the present invention is advantageous in that the insulating substrate 110 made of plastic material can be easily applied. Here, plastic such as polycarbon, polyimide, polyether sulfone (PES), polyarylate (PAR), polyethylene naphthalate (PEN), polyethylene terephthalate (PET) or the like can be used as the material for manufacturing the insulating substrate.

The gate wires 120, 121 and 123 are formed on the insulating substrate 110. The gate wires 120, 121 and 123 comprises the gate line 120 being crossed insulatedly with the data line 151 to define the pixel; the gate pad 123 provided at an end portion of the gate line 120 and receiving a driving or control signal from an outside; and the gate electrode 121 being a branch of the gate line 120 and formed at a location corresponding to the organic semiconductor layer 160 described below. The gate pad 123 receives the driving and control signals from an outside for turning on/off the thin film transistor and transmits the above signal to the gate electrode 121 via the gate line 120. The gate wires 120, 121 and 123 can be made of at least one of aluminum (Al), chrome (Cr), molybdenum (Mo), aurum (Au), platinum (Pt) and palladium (Pd) and may have a single layered or a multiple layered structure.

The gate insulating layer 130 covering the gate wires 120, 121 and 123 is formed on the insulating substrate 110. The gate insulating layer 130 is formed for insulating electrically the gate wires 120, 121 and 123 from the transparent electrode layers 141, 142, 143, 144 and 145 this gate insulating layer can be provided as the signal layer made of inorganic or organic material. Although not shown in the drawing, on the other hand, as another embodiment, the gate insulating layer 130 may have a dual layered structure consisted of a first gate insulating layer formed at a lower side and a second gate insulating layer formed at an upper side. Here, the first gate insulating layer can be the inorganic layer made of inorganic material such as silicon nitride ($SiN_x$) or silicon oxide ($SiO_x$) which has an excellent workability property. The second gate insulating layer can be formed of at least one material selected from the group consisted of silicon polymer, azobis isobutiro nitrile (AIBN), tetra butyl ortho titanate ($Ti(Obu)_4$) and butanol. On the other hand, when the gate wires 120, 121 and 123 are formed, chemical substance or plasma used for the gate wires is provided as a remainder, or remained, and entered in a gate pad contact hole 131 described below or between the interfaces, and so a characteristic of the organic semiconductor layer 160 which is vulnerable to chemical substance and plasma becomes lower. The gate insulating layer 130 prevents a characteristic of the organic semiconductor layer from damaging. The gate pad contact hole 131 is formed on the gate insulating layer 130 for exposing the gate pad 123.

The transparent electrode layers 141, 142, 143, 144 and 145 are formed on the gate insulating layer 130. The transparent electrode layers 141, 142, 143, 144 and 145 include the source electrode 141 and the drain electrode 142 disposed on the gate insulating layer 130 such that two electrodes are spaced from each other with the gate electrode 121 as a center to define a channel region; the pixel electrode 143 contacted partially with the drain electrode 142 and formed on at least a portion of the pixel; the data wire layer 144 contacted with the source electrode 141 through at least a portion thereof and formed along the data wires 151, 152 and 153; and the gate pad contacting layer 145 covering the gate pad 123 exposed through the gate pad contact hole 131. The transparent electrode layers 141, 142, 143, 144 and 145 are made of transparent conductive material such as indium tin oxide (ITO) or indium zinc oxide (IZO). The source electrode 141 is connected physically and electrically to the data line 151 described below, and so the image signal is transmitted to the source electrode. And, the drain electrode 142 forms the thin film transistor together with the source electrode 141 and acts as the switching and driving element for controlling and driving an operation of each pixel electrode 143. As compared with anther metal, an interface characteristic between the gate insulating layer 130 and the source/drain electrode 141/142 made of ITO or IZO is superior, and so a characteristic of the organic thin film transistor is enhanced. Also, since a work function of ITO or IZO is similar to or somewhat lager than that of the organic semiconductor layer 160, the organic thin film transistor is advantageous in that its characteristic is enhanced and it is possible to adjust optimally the work function of ITO or IZO through the self assembly monolayer (SAM) process. The pixel electrode 143 and the data wires 151, 152 and 153 are not formed on the same layer so that it is possible to prevent a failure caused by a short between the pixel electrode 143 and the data wires 151, 152 and 153 from occurring.

The data wires 151, 152 and 153 are formed on one area of the transparent electrode layers 141, 142, 143, 144 and 145. The data wires 151, 152 and 153 include the data line 151 and are crossed insulatedly with the gate line 120 to define the pixel; the data pad 152 provided at an end portion of the data line 151 and receiving the driving or control signal from an outside; and the metal layer formed on the gate pad contact layer 145. It is desirable that the data line 151 formed on the source electrode 141 is spaced apart from the organic semiconductor layer 160. The reason why the data line 151 is formed as above is as follows. Metal used for forming the data wires 151, 152 and 153 has a work function which is smaller than that of the organic semiconductor layer 160 so that a characteristic of the organic thin film transistor may be lowered. The data pad 152 receives the driving and control signals from an outside and transmits the above signal to the data line 151. Material used for forming the data wires 151, 152 and 153 is aluminum (Al), chromium (Cr) or molybdenum (Mo), each of which is inexpensive and has the good conductivity. However, at least one of gold/aurum (Au), platinum (Pt) and palladium (Pd) which are relatively expensive can be used as material for forming the data wires. Further, alloys of the above materials may be used. The data wires 151, 152 and 153 may have a single-layered or a multiple-layered structure made of at least one of the above mentioned materials. On the other hand, unlike the structure shown in the drawing, the metal layer 153 is etched away through the photolithography process, and so only the gate pad contacting layer 145 can be provided as a remainder, or remained, on the gate pad 123. Remained or remaining in this context includes the residual or resulting structure following a process step or a sequence of steps. The data wires 151, 152 and 153 are connected electrically to the data wire layer 144 formed therebelow. Due to such a structure, the control and driving signal transmitted from the data pad 152 is transmitted through the data line 151 made of metal having a low resistance, not through the data line made of ITO or IZO, and so the signal transmission delay is minimized. That is, in particular, the multiple-layered structure is formed by the data wires and the data wire layer 144 made of ITO or IZO and formed below the data wires and the data wires and the data wire layer are connected electrically to each other, and thus a sectional surface area of the data wires through which the signal is transmitted is increased, and thus a resistance level is reduced and transmission of the data signal can be achieved more smoothly.

The organic semiconductor layer 160 is formed on the channel region. The organic semiconductor layer 160 covers the channel region and is contacted partially with the source electrode 141 and the drain electrode 142. Such an organic semiconductor layer 160 may be made of one selected from the group consisting of a derivative including tetracene or pentacene substituent; 4 to 8 oligothiophene coupling to one another through 2- and 5-positions of the tiophene rings; perylenetetracarboxylic dianhydride or an imide derivate thereof; naphtalenetetracarboxylic dianhydride or an imide derivate thereof; metalized phthalocyanine or an halogen derivate thereof; perylene or coronene and a derivate including substitutents thereof; co-oligomer or copolymer of thienylene and vinylene; tiophene; thienylene or coronene and a derivate including substitutents thereof; and a derivate including one or more hydro carbon chains having 1 to 30 carbons in an aromatic or heteroaromatic ring of said materials. Besides the above, other well known organic semiconductor material which have been generally used may be used for the organic semiconductor layer of an embodiment of the present invention.

Although not shown in the drawing, on the other hand, a wall is provided such that the channel region is surrounded with the wall and at least a portion of the drain electrode 142 and the source electrode 141 is exposed by the wall, and the organic semiconductor layer 160 can be formed inside of the wall. The above structure is applicable to a case of forming the organic semiconductor layer 160 using an ink jet type deposition method.

A first passivation layer 170 is formed on the organic semiconductor layer 160. The first passivation layer 170 covers the organic semiconductor layer 160 and may be formed of a fluorine-based high molecular material. Fluorine high molecular material can be made of any one of the group consisting of a cyclized transparent high molecular material obtained from copolymer of poly tetra fluoro ethylene (PTET), fluorinated ethylene propylene (FEP), poly fluoro alkoxy (PFA), ethylene tetra fluoro ethylene (ETFE), polyvinylidene fluoride (PVDF), perfluoro (alkenylvinyl ethers). Unlike the above material, the first passivation layer 170 can be the organic layer made of at least one of polyvinyl alcohol (PVA), benzocyclobutene (BCB), acrylic resin, silicon polymer and the like. The first passivation layer 170 is formed for preventing a characteristic of the organic semiconductor layer 160 from being degraded.

And, a second passivation layer 180 can be formed on the first passivation layer 170. The second passivation layer 180 is formed optionally and serves as the layer which covers the first passivation layer 170 and prevents the semiconductor layer 160 from being degraded together with the first passivation layer 170. The second passivation layer 180 can be made of any one of indium tin oxide (ITO) and indium zinc oxide (IZO). Alternately, the second passivation layer 180 can be made of known material which is the same as the material used for forming the first passivation layer 170 or another known material.

Figure 3A:
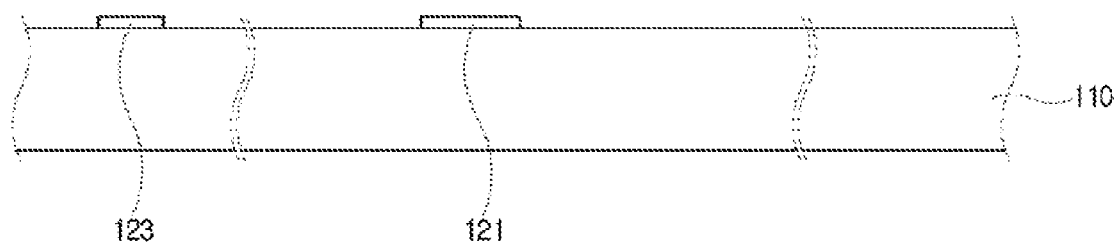

Hereinafter, a method for manufacturing the liquid crystal display device provided with the organic thin film transistor is described with reference to FIG. 3A to FIG. 3I. As shown in FIG. 3A, the insulating substrate 110 made of insulating material such as glass, quartz, ceramic or plastic or the like is provided. It is preferable that the plastic substrate is used for manufacturing the flexible liquid crystal display device. Data wire material is deposited on the insulating substrate 110 through the chemical vapor deposition (CVD) method or the sputtering method, and the gate line 120, the gate electrode 121 and the gate pad 123 are then formed through the photolithography process.

Figure 3B:
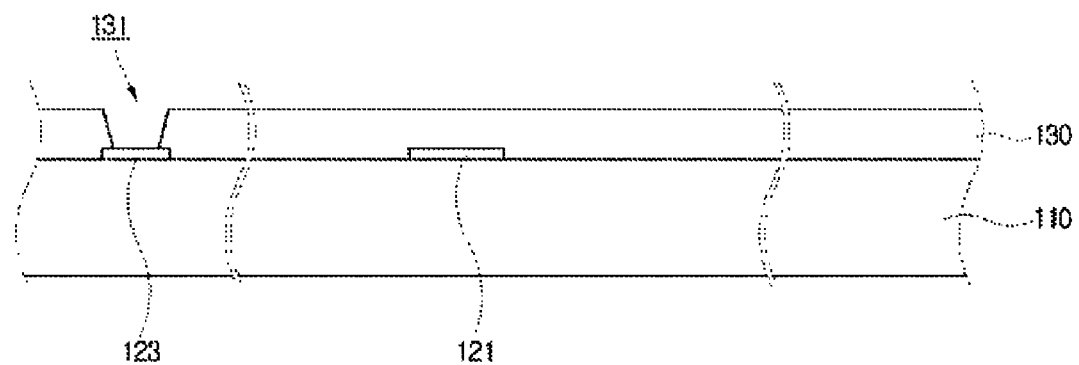

As shown in FIG. 3B, gate insulating material formed of organic material or inorganic material is applied to the insulating substrate 110 to form the gate insulating layer 130 covering the gate wires 120, 121 and 123. If gate insulating material is an organic material, the gate insulating layer can be formed by the coating method. Alternatively, if gate insulating material is an inorganic material, the gate insulating layer can be formed through the chemical vapor deposition method, the plasma enhanced chemical vapor deposition method or the like. On the other hand, although not shown in the drawing, as another embodiment, the gate insulating layer 130 may has the dual-layered structure consisted of a first gate insulating layer at a lower side and a second gate insulating layer at an upper side. Here, the first gate insulating layer may be the inorganic layer made of inorganic material such as silicon nitride ($SiN_x$) or silicon oxide ($SiO_x$), the second gate insulating layer may be made of at least one of silicon based polymer, azobis isobutiro nitrile (AIBN), tetra butyl ortho titanate ($Ti(Obu)_4$) and butanol. Also, the gate pad contact hole 131 through which the gate pad 123 is exposed is formed through an etching process using a photosensitive organic layer as the barrier wall.

Figure 3C:
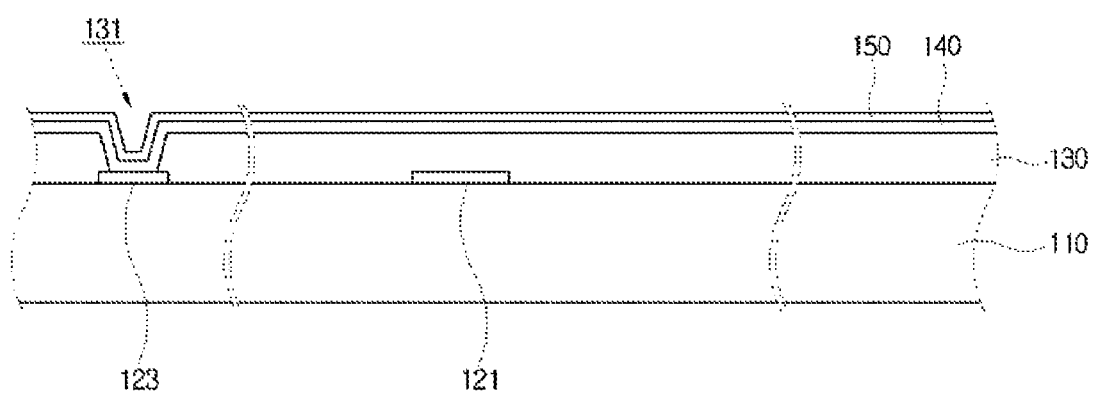

Then, as shown in FIG. 3C, transparent electrode material consisted of indium tin oxide (ITO) or indium zinc oxide (IZO) and data wire material containing including at least one of aluminum (Al), chromium (Cr), molybdenum (Mo), gold/aurum (Au), platinum (Pt) and palladium (Pd) are sequentially applied on the gate insulating layer 130 to form a lower transparent electrode material layer 140 and an upper data wire material layer 150. The transparent electrode material layer 140 and the data wire material layer 150 are formed by the sputtering method.

Figure 3D:
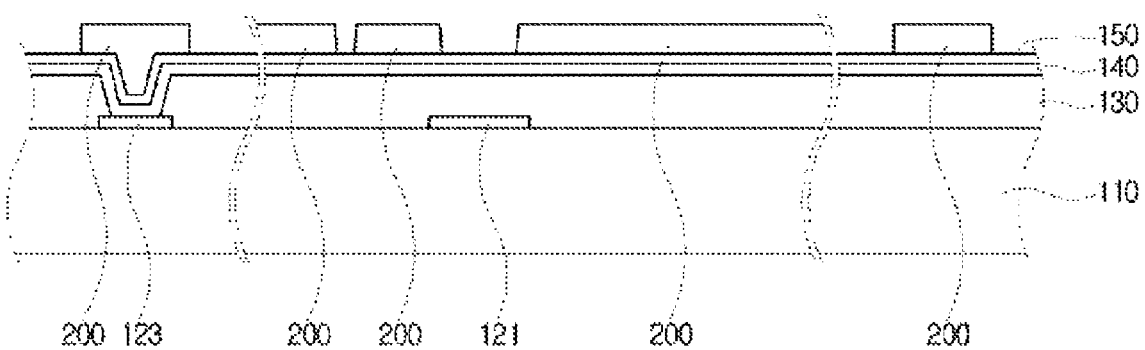

Next, as shown in FIG. 3D, a photosensitive layer 200 is formed on the data wire material layer 150 through the coating method, the photosensitive layer 200 is then removed through a lithography and developing processes using a mask except some photosensitive layer formed on the areas corresponding to the source electrode 141, the drain electrode 142, the pixel electrode 143, the data wire layer 144 and the gate pad gate pad contacting layer 145 which will be formed later. Here, the photosensitive layer 200 may be the photosensitive organic layer.

Figure 3E:
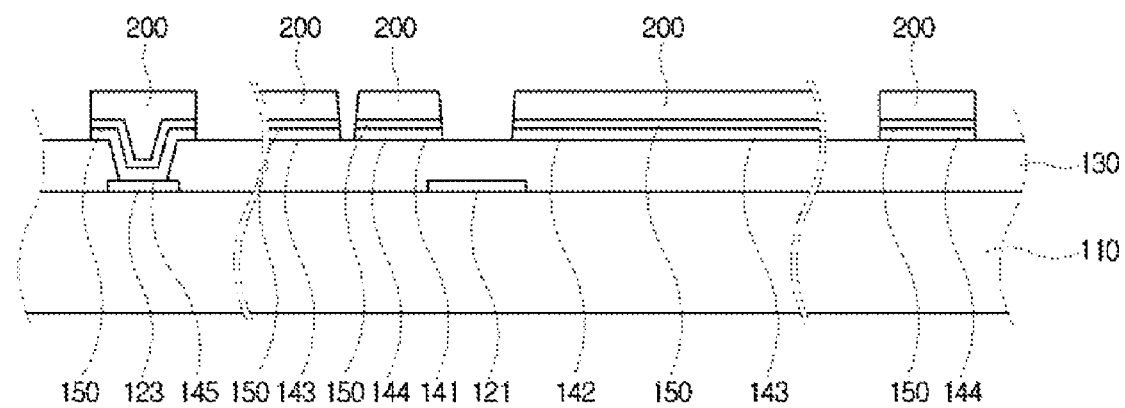

Next, as shown in FIG. 3E, the data wire material layer 150 and the transparent electrode material layer 140 on which the photosensitive layer 200 is not formed (that is, exposed through the photosensitive layer 200) are removed the etching process using the remaining, or remained, photosensitive layer 200 as the barrier wall. Due to such process, the transparent electrode material layer 140 is patterned into the transparent electrode layer comprising the source electrode 141, the drain electrode 142, the pixel electrode 143, the data wire layer 144 and the gate pad contacting layer 145.

Figure 3F:
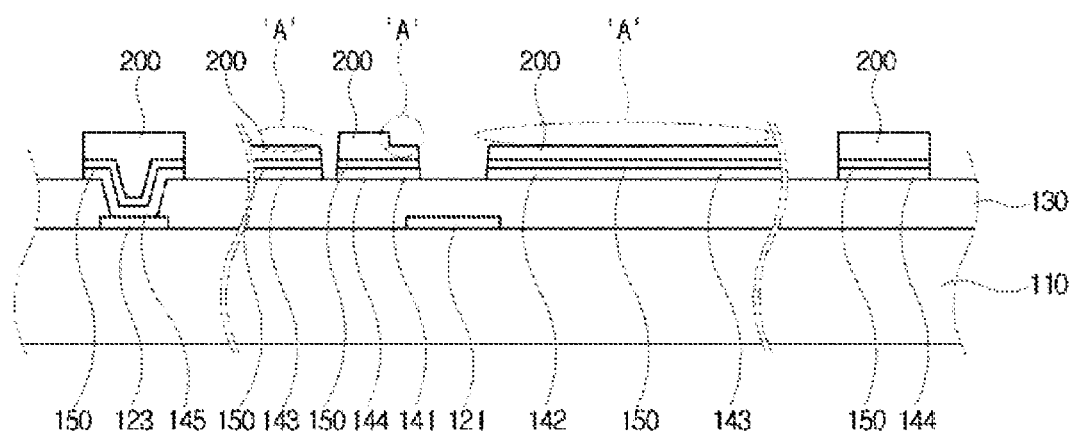
Figure 3G:
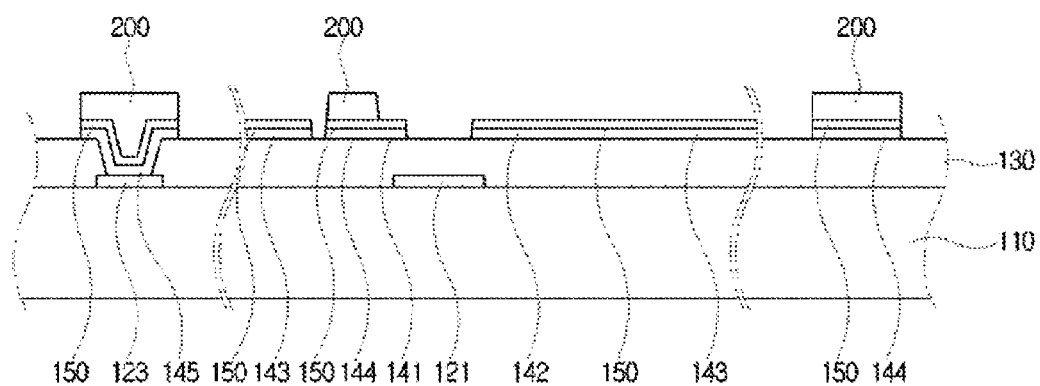

Next, as shown in FIG. 3F, a height of the photosensitive layer 200 corresponding to a region A on which the data wires 151, 152 and 153 are formed later is decreased through the lithography and developing processes using a slit mask. Further, as shown in FIG. 3G, the remaining, or remained, photosensitive layer 200, except the portion corresponding to the region on which the data wires 151, 152 and 153 are formed, is removed. The removed photosensitive layer 200 is the photosensitive layer 200 whose thickness was decreased in the former process.

Figure 3H:
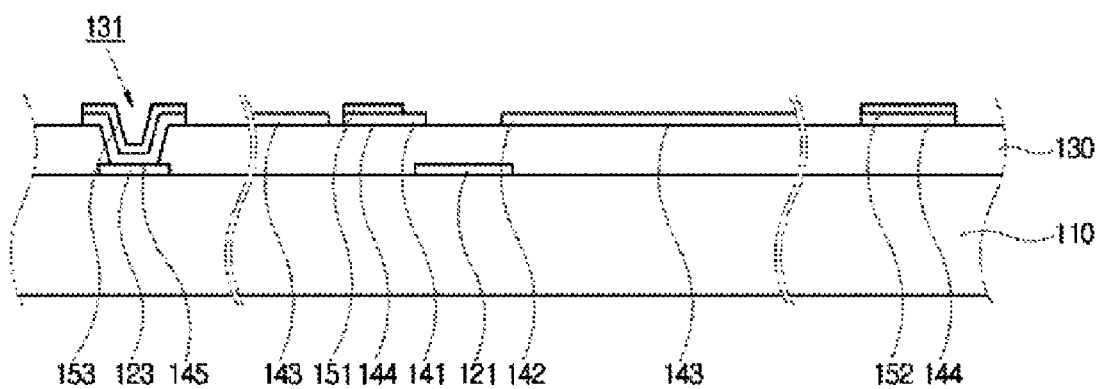
Figure 31:
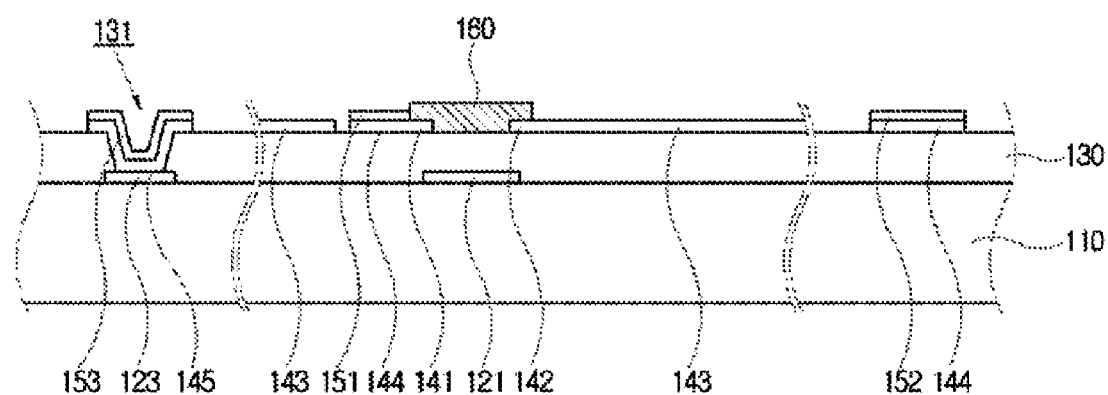

Next, as shown in FIG. 3H, the etching process is preformed using the remaining, or remained, photosensitive layer 200 to form the data wires comprising the data line 151, the data pad 152 and the metal layer 153. Further, the pixel electrode 143 is exposed to an exterior region or outside. Here, it is desirable that the data line 151 is spaced apart from the organic semiconductor layer 160. Since a work function of the organic semiconductor layer 160 is larger than that of the above metal, a characteristic of the organic thin film transistor can be lowered. This is why the data line is spaced apart from the organic semiconductor layer. Unlike the embodiment, on the other hand, it is possible to remove the metal layer 153 by reducing a thickness of the photosensitive layer 200 on the gate pad 123 in the former process.

Next, as shown in FIG. 3I, the organic semiconductor material layer is formed and patterned to form the organic semiconductor layer 160 on only the channel region. The organic semiconductor material layer can be formed through the evaporation method or the coating method, and the organic semiconductor material layer may be patterned by the photolithography process. Here, the organic semiconductor layer can comprises any one selected from the group consisting of a derivative including tetracene or pentacene substituent; 4 to 8 oligothiophene coupling to one another through 2- and 5-positions of the tiophene rings; perylenetetracarboxylic dianhydride or an imide derivate thereof; naphtalenetetracarboxylic dianhydride or an imide derivate thereof; metalized phthalocyanine or an halogen derivate thereof, perylene or coronene and a derivate including substitutents thereof; co-oligomer or copolymer of thienylene and vinylene; tiophene; thienylene or coronene and a derivate including substitutents thereof; and a derivate including one or more hydro carbon chains having 1 to 30 carbons in an aromatic or heteroaromatic ring of said materials.

Although not shown in the drawing, on the other hand, as another embodiment, a wall is provided such that the channel region is surrounded by the wall and at least a portion of the drain electrode 142 and the source electrode 141 is exposed by the wall, and the organic semiconductor layer 160 can be formed inside of the wall through the ink jet method.

Next, although not shown in the drawing, the first passivation layer 170 made of fluorine-based high molecular material is formed on the organic semiconductor layer 160 through a spin coating or slit coating method. The second passivation layer 180 made of at least one of indium tin oxide (ITO) and indium zinc oxide (IZO) is successively formed on the first passivation layer 170 by the sputtering method. Here, the first passivation layer 170 and the second passivation layer 180 can be patterned simultaneously through the photolithography process. On the other hand, as another embodiment, after the first passivation layer 170 is formed, the first passivation layer 170 is patterned, and the second passivation layer 180 can be then formed and patterned. Here, fluorine high molecular material can be made of any one of the group consisting of a cyclized transparent high molecular material obtained from copolymer of poly tetra fluoro ethylene (PTET), fluorinated ethylene propylene (FEP), poly fluoro alkoxy (PFA), ethylene tetra fluoro ethylene (ETFE), polyvinylidene fluoride (PVDF), and perfluoro (alkenylvinyl ethers). Unlike the above material, the first passivation layer 170 can be the organic layer made of at least one of polyvinyl alcohol (PVA), benzocyclobutene (BCB), acrylic resin, silicon polymer and the like.

According to the embodiment of the present invention, the mask is used for forming the gate wires 120, 121 and 123, the gate insulating layer 130, the transparent electrode layers 141, 142, 143, 144 and 145 and the organic semiconductor layer 160. As compared with the conventional process for manufacturing the organic thin film transistor, the number of using the mask in the present invention is remarkably reduced. Owing to the above, the method for manufacturing the display device comprising the organic thin film transistor which can simplify the manufacturing process and save the manufacturing cost is provided.

Below, another embodiment of the present invention is described with reference to FIG. 4A to FIG. 4C. In below description, only the distinctive constitution of another embodiment which differs from the former embodiment is described, a section which is not described is based upon the former embodiment or the known prior art. For convenience of description, the structural elements of this embodiment which are the same as those the former embodiment are designated by the same reference numerals.

Figure 4A:
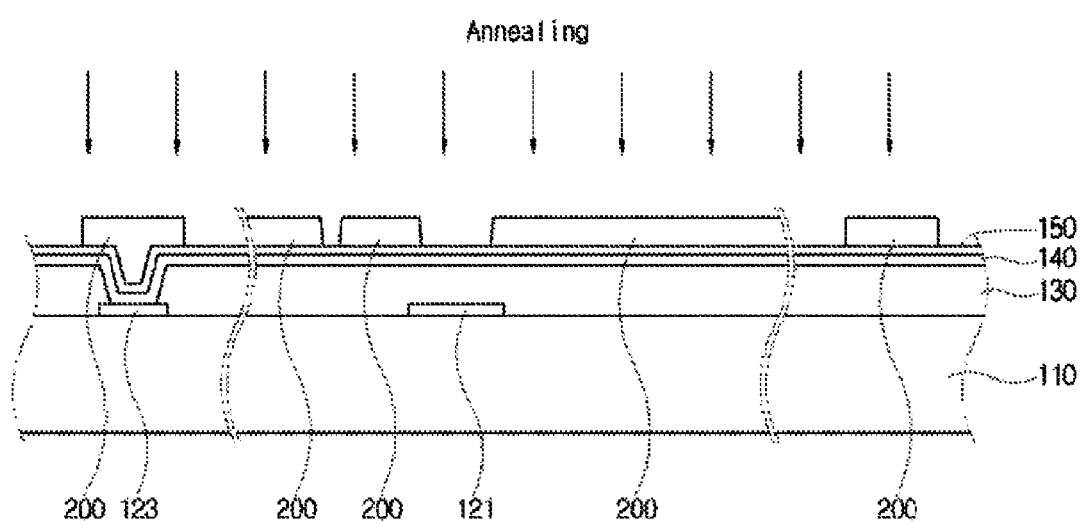
FIG. 4A to FIG. 4C are sectional views for illustrating a method for manufacturing the display device according to another embodiment of the present invention.

As shown in FIG. 4A, in the state that the photosensitive layer 200 is formed on the regions of the data wire material layer 150, which corresponds to the source electrode 141, the drain electrode 142, the pixel electrode 143, the data wire layer 144 and the gate pad contacting layer 145, an annealing process is carried out. The annealing process is the process for converting a condition of material into the stable state, material is sufficiently heated and then cooled slowly in the annealing process. The amorphous transparent electrode material layer 140 is converted into the stable poly or crystalline transparent electrode material layer by the annealing process.

Figure 4B:
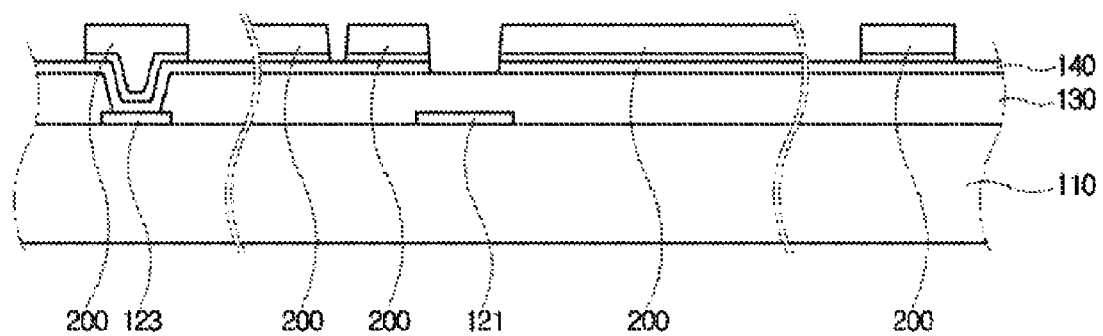
Figure 4C:
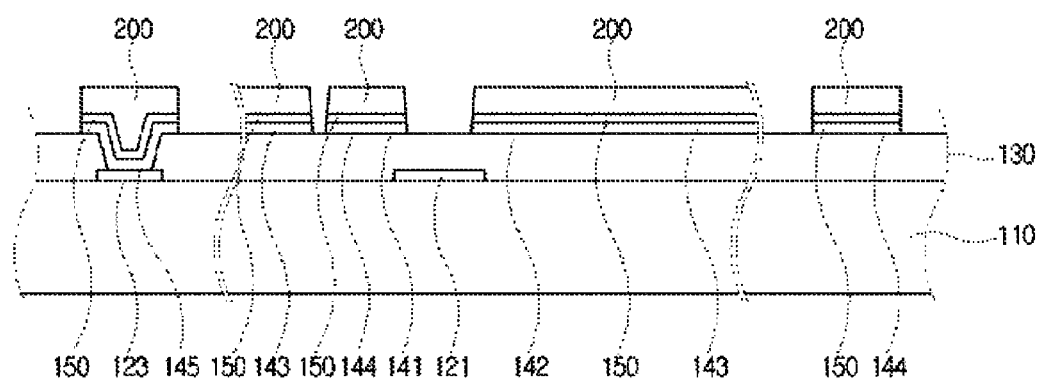

Then, as shown in FIG. 4B, the data wire material layer 150 is patterned by using chromium (Cr) etchant to remove the regions of the data wire material layer which are not covered with the photosensitive layer 200. In this case, since the amorphous transparent electrode material layer 140 has been converted into the stable poly or crystalline transparent electrode material layer by the annealing process, the amorphous transparent electrode material layer is not any influenced by chromium (Cr) etchant and only the data wire material layer 150 is removed.

Next, as shown in FIG. 4A, the transparent electrode material layer 140 is patterned using the provided or remaining photosensitive layer 200 as the barrier wall and etchant for etching the transparent electrode material (ITO or IZO) to form the transparent electrode layers comprising the source electrode 141, the drain electrode 142, the pixel electrode 143, the data wire layer 144 and the gate pad contacting layer 145. Due to above method, the method for manufacturing the more stable display device is provide.

As described above, according to one or more embodiments of the present invention, the display device comprising an organic thin film transistor having a novel structure and an improved characteristic is provided. Also, the method for manufacturing the display device comprising the organic thin film transistor which has the new structure and can be manufactured by the simple manufacturing process is provided.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device, comprising:
    an insulating substrate;
    a plurality of gate lines formed on the insulating substrate, the plurality of gate lines including a plurality of gate electrodes;
    a gate insulating layer covering the plurality of gate lines;
    a plurality of data lines formed on the gate insulating layer and comprising a lower layer and an upper layer;
    a plurality of source electrodes and a plurality of drain electrodes formed on the gate insulating layer and being spaced apart from each other to define a channel region disposed therebetween;
    an organic semiconductor layer formed on the channel region for each pixel, and physically in contact with the source electrode and the drain electrode, a predetermined portion of the organic semiconductor layer overlapping portions of the source electrode, and the drain electrode, to form a transistor along with the gate electrode; and
    a plurality of pixel electrodes formed directly on the gate insulating layer,
    wherein the source electrodes, the drain electrodes, and the pixel electrodes are formed with the same layer as the lower layer of the data lines.

2. The display device according to claim 1, wherein the source electrodes are extended from the lower layer of the data lines.

3. The display device according to claim 2, wherein the gate lines further comprise a plurality of gate pads formed at end portions of the gate lines, and the plurality of data lines further comprise a plurality of data pads provided at end portions of the data lines, and wherein the data pads comprise the lower layer and the upper layer.

4. The display device according to claim 3, further comprising:
    a plurality of gate pad contacting layers covering the gate pads and formed with the same layer as the lower layer of the data lines.

5. The display device according to claim 4, further comprising:
    a plurality of metal layers formed on the gate pad contacting layers and formed with the same layer as the upper layer of the data lines.

6. The display device according to claim 1, wherein the lower layer of the data lines comprises at least one of indium tin oxide (ITO) and indium zinc oxide (IZO).

7. The display device according to claim 1, further comprising a first passivation layer formed on the channel region on the organic semiconductor layer.

8. The display device according to claim 7, further comprising a second passivation layer formed on the first passivation layer.

9. The display device according to claim 8, wherein the first passivation layer comprises a fluorine-based high molecular material and the second passivation layer comprises at least one of indium tin oxide and indium zinc oxide.

10. The display device according to claim 8, wherein the first passivation layer comprises any one of the group consisting of
    a cyclized transparent high molecular material obtained from copolymer of poly tetra fluoro ethylene (PTET),
    fluorinated ethylene propylene (FEP),
    poly fluoro alkoxy (PFA), ethylene tetra fluoro ethylene (ETFE),
    polyvinylidene fluoride (PVDF), and
    perfluoro (alkenylvinyl ethers).

11. The display device according to claim 1, wherein the gate insulating layer comprises a first gate insulating layer and a second gate insulating layer, the first gate insulating layer comprises at least one of silicon nitride ($SiN_x$) and silicon oxide ($SiO_x$), and the second gate insulating layer comprises at least one of a silicon based polymer, azobis isobutiro nitrile (AIBN), tetra butyl ortho titanate ($Ti(Obu)_4$) and butanol.

12. The display device according to claim 1, wherein the organic semiconductor layer comprises a material selected from the group consisting of
    a derivative including tetracene or pentacene substituent;
    4 to 8 oligothiophene coupling to one another through 2- and 5-positions of the tiophene rings;
    perylenetetracarboxylic dianhydride or an imide derivate thereof;
    naphtalenetetracarboxylic dianhydride or an imide derivate thereof;
    metalized phthalocyanine or an halogen derivate thereof, perylene or coronene and a derivate including substitutents thereof;
    co-oligomer or copolymer of thienylene and vinylene;
    tiophene;
    thienylene or coronene and a derivate including substitutents thereof; and
a derivate including one or more hydro carbon chains having 1 to 30 carbons in an aromatic or heteroaromatic ring of said materials.

* * * * *